(12) United States Patent
Tomioka et al.

(10) Patent No.: US 7,439,550 B2
(45) Date of Patent: Oct. 21, 2008

(54) SEMICONDUCTOR LIGHT EMITTING DEVICE

(75) Inventors: Yuko Tomioka, Tokyo (JP); Seiichiro Kobayashi, Tokyo (JP); Kazuki Takeshima, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 67 days.

(21) Appl. No.: 11/276,498

(22) Filed: Mar. 2, 2006

(65) Prior Publication Data

US 2006/0197099 A1    Sep. 7, 2006

(51) Int. Cl.
*H01L 29/205*  (2006.01)
*H01L 33/00*   (2006.01)

(52) U.S. Cl. .................... 257/91; 257/E33.065
(58) Field of Classification Search ............. 257/91, 257/E33.026
See application file for complete search history.

(56) References Cited

U.S. PATENT DOCUMENTS 5,309,001 A * 5/1994 Watanabe et al. ............ 257/99
5,698,865 A * 12/1997 Gerner et al. ................ 257/94
2004/0119078 A1* 6/2004 Konno et al. ................ 257/79

FOREIGN PATENT DOCUMENTS

JP         2004296979        10/2004

* cited by examiner

*Primary Examiner*—Evan Pert
*Assistant Examiner*—Ben P Sandvik
(74) *Attorney, Agent, or Firm*—Cermak Kenealy & Vaidya LLP

(57) ABSTRACT

A semiconductor light emitting device can be configured to prevent diffusion migration of components constituting a linear electrode. The semiconductor light emitting device can include a substrate, at least one semiconductor layer formed on the substrate and having a topmost semiconductor layer, a pad electrode formed from a plurality of layers provided on the topmost semiconductor layer, and a linear electrode provided on the topmost semiconductor layer. The linear electrode can be configured to overlap the topmost semiconductor layer except for an area occupied by the pad electrode. The linear electrode can also be configured to make contact with part of the pad electrode, and form an ohmic contact with the topmost semiconductor layer. The pad electrode can include, as one of the plurality of layers, a barrier metal layer that covers part of or all of an upper surface and/or a sidewall of the linear electrode at a contact area between the linear electrode and the pad electrode.

16 Claims, 4 Drawing Sheets

SEMICONDUCTOR LIGHT EMITTING DEVICE

This application claims the priority benefit under 35 U.S.C. §119 of Japanese Patent Application No. 2005-060246 filed on Mar. 4, 2005, which is hereby incorporated in its entirety by reference.

BACKGROUND OF THE INVENTION

1. Field of the Invention

The invention relates to a semiconductor light emitting device, and particularly relates to a semiconductor light emitting device that can include a modified electrode structure.

2. Description of the Related Art

An opaque pad electrode whose rear surface is wire bonded can be employed in conventional type semiconductor light emitting devices. Even if light is emitted, the light is shielded or absorbed by the pad electrode. Light emissions cannot be efficiently produced on the rear surface area and the luminous efficiency drops with respect to the applied electrical power.

In order to solve this problem, a device called a current confined path type light emitting diode can be used. This type of LED is provided with a pad electrode locally formed on the topmost layer of semiconductor layers and a linear electrode with an approximate mesh shape part of which makes contact with the pad electrode. Furthermore, a Schottky contact is formed between the pad electrode and the topmost layer of semiconductor layers, thereby preventing the leakage of current and the emission of light at areas covered by the pad electrode as well as preventing decreases in the quantity of light emitted with respect to the applied electrical power.

Figure 1:
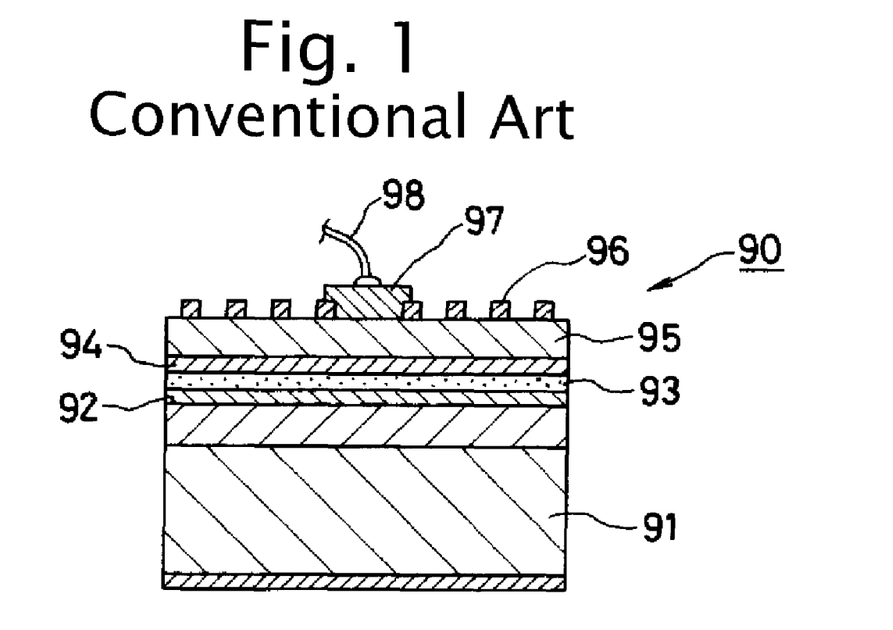
FIG. 1 is a cross-sectional view showing a conventional example.
Figure 2:
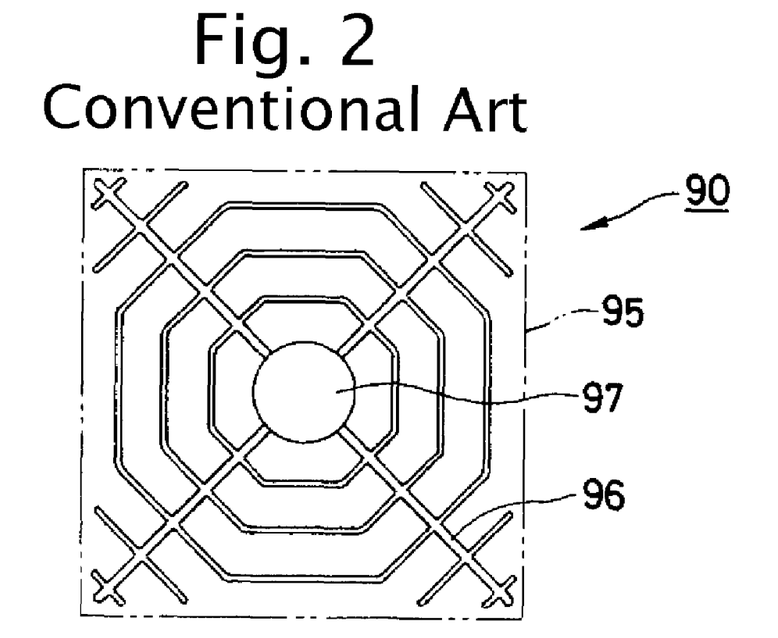
FIG. 2 is a top view showing the conventional example of FIG. 1.

FIG. 1 and FIG. 2 show examples of the configuration of this type of conventional current confined path type light emitting diode 90 (for example, see Japanese Patent Laid-Open Publication No. 2004-296979, which is hereby incorporate in its entirety by reference). As shown in the cross section in FIG. 1, this light emitting diode 90 includes a P-type semiconductor layer 92, an active layer 93, an N-type semiconductor layer 94, and a topmost semiconductor layer 95 formed of n-AlGaInP.

As shown in FIG. 2, on the topmost semiconductor layer 95 a linear electrode 96 is provided made of a metal such as An/Sn/Ni. The linear electrode 96 has a shape like a spider web that can evenly supply electrical current over a wide range of the topmost semiconductor layer 95. The topmost semiconductor layer 95 and the linear electrode 96 are thermally alloyed to form an ohmic contact therebetween.

An electrode used for a pad 97 is formed at the center of the linear electrode 96 so as to make contact with both the topmost semiconductor layer 95 and the linear electrode 96. Metal material, such as Ti/Au/Pt, that has work functions larger than the electron affinity of the topmost semiconductor layer 95 is selected for the electrode used for a pad 97 at this time. Then, a bonding wire 98 is connected to the electrode used for a pad 97 to allow power to be supplied from an external source.

According to this configuration, an ohmic contact is formed between the topmost semiconductor layer 95 and the linear electrode 96. An ohmic contact is also formed between the linear electrode 96 and the electrode used for a pad 97, and only a Schottky contact is formed between the topmost semiconductor layer 95 and the electrode used for a pad 97.

Therefore, the electrical power supplied to the bonding wire 98 is transmitted to the topmost semiconductor layer 95 from the electrode used for a pad 97 through the linear electrode 96 and electrical current is not supplied to the topmost semiconductor layer 95 from the electrode used for a pad 97 (Schottky connected). Because of this, light does not irradiate from the area under the electrode used for a pad 97 and there is no ineffective electrical power consumed.

In the configuration of the conventional current confined path type light emitting diode 90 described above, the irradiation of light from the area under the electrode used for a pad 97 can surely be prevented, although a problem occurs in which a metal such as Ge or Zn, which is added to the linear electrode 96 in order to improve the ohmic contact between the topmost semiconductor layer 95 and the linear electrode 96, deposits on the electrode used for a pad 97 during the thermal alloying, thereby weakening the bonding strength of the bonding wire 98.

When the linear electrode 96 is laid out, the position of the linear electrode 96 should be taken into consideration because the linear electrode 96 may also shield the light irradiation. To cope with this problem, it is possible to thinly form the electrode in a range in which a sufficient amount of electrical power will be provided to the LED chip 91. However, a phenomenon easily occurs in which Ge or Zn, which is added to the linear electrode 96 as described above, concentrate at one area during the thermal alloying and, for example, the resistance value of the linear electrode 96 thereby increases. Due to this, there is a limit of approximately 5 μm on the width, and the electrode cannot be thinly formed. Consequently, although the configuration is complicated, a problem also occurs wherein the light gathering efficiency is not improved.

SUMMARY

As a specific method to solve the conventional problems mentioned above and other problems, one aspect of the subject matter described herein provides a semiconductor light emitting device that can include: a substrate; at least one semiconductor layer formed on the substrate, having a topmost semiconductor layer; a pad electrode formed from a plurality of layers provided on the topmost semiconductor layer; and a linear electrode provided on the topmost semiconductor layer covering the topmost semiconductor layer except for an area occupied by the pad electrode, making contact with part of the pad electrode, and forming an ohmic contact with the topmost semiconductor layer. In this device, the pad electrode can include, as one of the plurality of layers, a barrier metal layer that covers part of or all of an upper surface and a sidewall of the linear electrode at a contact area between the linear electrode and the pad electrode.

In the semiconductor light emitting device according to the above aspect, the pad electrode may form a Schottky contact with the topmost semiconductor layer.

In the semiconductor light emitting device according to the above aspect, a bonding layer may be provided between the barrier metal layer within the pad electrode and the topmost semiconductor layer and/or the linear electrode at the contact area between the linear electrode and the pad electrode.

In the semiconductor light emitting device according to the above aspect, at least one layer among the plurality of layers of the pad electrode may be a bonding layer that makes contact with the topmost semiconductor layer, and the bonding layer may be formed from a material that has a barrier function.

In the semiconductor light emitting device according to the above aspect, the linear layer may comprise a plurality of layers, at least one of which is a barrier metal layer.

In the semiconductor light emitting device according to the above aspect, the linear electrode can have a mesh type shape, a spider web shape, a radial pattern shape, a grid pattern shape, or other shape.

In addition, the pad electrode can be provided for wire bonding in like manner to the electrode used for a pad of the conventional technique described above, and functions to supply power to the linear electrode as well as has enough surface area for at least a wire bond.

According to an aspect of the described subject matter, the conventional problems mentioned above as well as other problems can be solved by the linear electrode that forms an ohmic contact with the topmost semiconductor layer and by preventing diffusion migration of the component that constitutes the linear electrode, through the connection portion of the pad electrode. In other words, the bonding strength of the gold wire and the Schottky characteristics of the pad electrode can be maintained by preventing diffusion migration of the linear electrode component to the topmost surface of the pad electrode. In addition, the Schottky characteristics of the pad electrode can be maintained by preventing diffusion migration of the linear electrode component to the bottom surface (Schottky contact surface) of the pad electrode when the pad electrode is Schottky connected with the topmost semiconductor layer.

Secondly, a barrier metal layer can be provided within the layer structure of each of the pad electrode and the linear electrode which forms an ohmic contact with the topmost semiconductor layer. This can prevent the deposition of Ge or Zn onto the electrode surface due to diffusion or migration in any of the process steps of the thermal alloying process in the element manufacturing process. This can produce flexibility in the procedures for manufacturing the elements.

In addition, components such as Ge or Zn do not concentrate at one area within the linear electrode with any loss in the conductivity of the linear electrode. The linear electrode that conventionally has an approximate limit of 5 μm on the width can also be thinly produced up to approximately 2 μm. This results in a device that can effectively extract the quantity of light conventionally shielded by this linear electrode to the outside, leading to an effect that allows an even brighter LED to be produced.

BRIEF DESCRIPTION OF THE DRAWINGS

These and other characteristics, and features will become clear from the following description with reference to the accompanying drawings, wherein.

DETAILED DESCRIPTION OF EXEMPLARY EMBODIMENTS

Next, embodiments shown in the drawings will be described in detail. The embodiments relate to a configuration and manufacturing method for a light emitting diode 1 which is a type of a current confined path type light emitting diode.

In order to prevent diffusion migration of the linear electrode elements in the upward direction and/or the lateral direction towards the pad electrode in the light emitting diode, a barrier metal layer can be provided on the top of the linear electrode as well as on a portion or all of the sidewall thereof at the contact area between the linear electrode and the pad electrode. A bonding layer can also be provided between the barrier metal layer and the topmost semiconductor layer and/or between the barrier metal layer and the linear electrode construction. The bonding layer can also have a barrier function.

TiWN, TaN, WN, Ni, or NiV can be used as the material of the barrier metal layer provided at the contact area between the linear electrode and the pad electrode. However, materials with similar effect can be used, and there is no limitation for selecting the material of the barrier metal layer.

Figure 3:
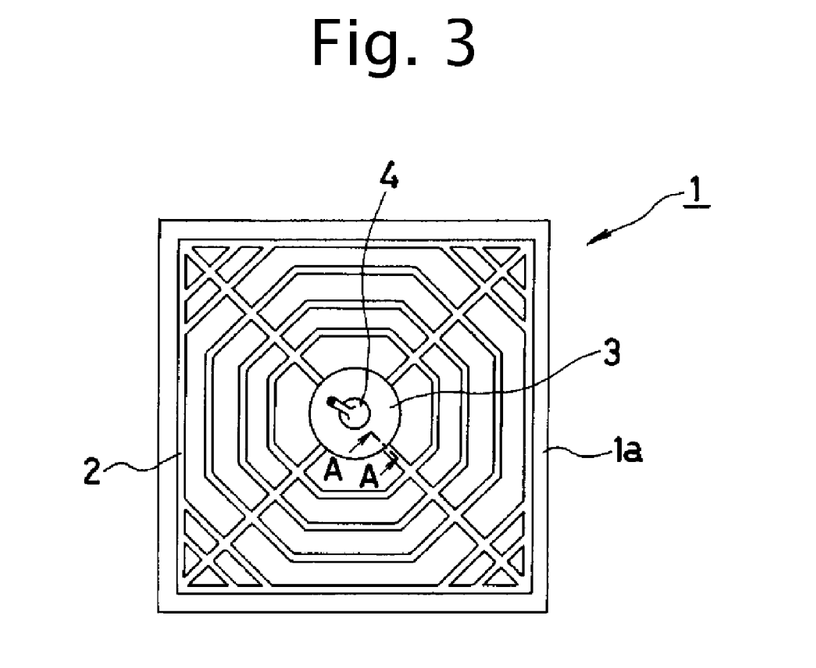
FIG. 3 is a plan view showing an embodiment of a semiconductor light emitting device made in accordance with principles of the invention.
Figure 4:
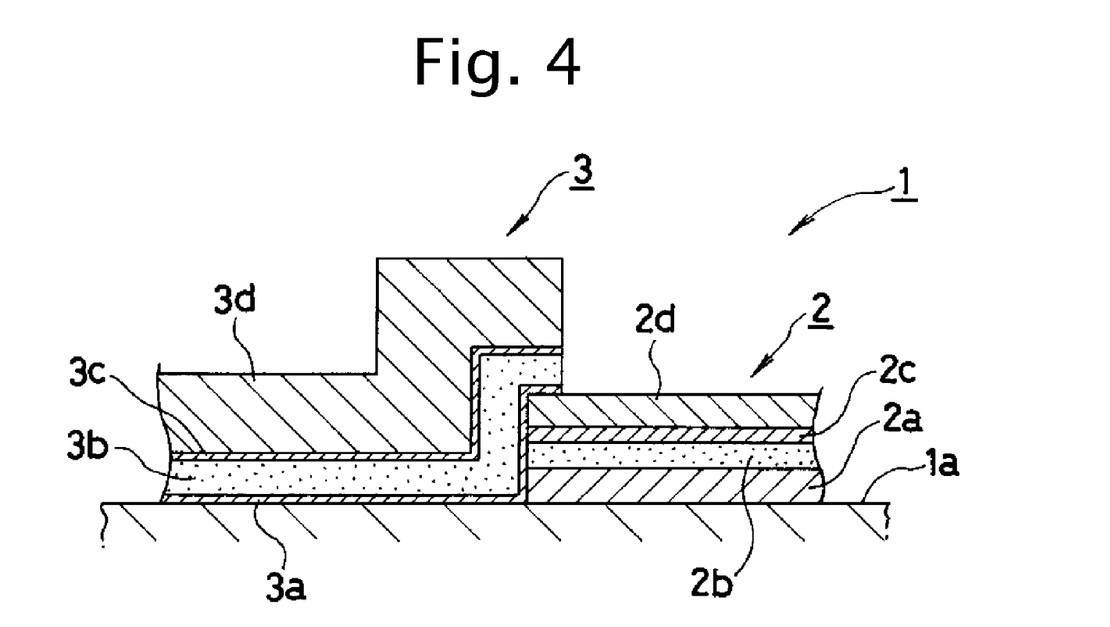
FIG. 4 is a cross-sectional view taken along the line A-A of FIG. 3.

FIG. 3 and FIG. 4 show an embodiment of a semiconductor light emitting diode 1. FIG. 3 is a plan view and FIG. 4 is a cross-sectional view showing portions of the pad electrode 3 and the linear electrode 2. Both the pad electrode 3 and the linear electrode 2 can be provided in a bonded state on the surface of the topmost semiconductor layer 1a. The linear electrode 2 and the pad electrode 3 can be partly bonded with each other.

When the topmost semiconductor layer 1a is composed of an n-type semiconductor, examples of the material used for the linear electrode 2 that can form an ohmic contact with the topmost semiconductor layer 1a include a metal such as Au, Ge, Sn, Ni, and Zn and their eutectic alloys. The linear electrode 2 can be substantially any shape and supply electrical current in the surface direction of the semiconductor layer. Examples of shapes include a mesh type, a spider web shape, a radial pattern, a grid pattern, and the like.

In the conventional example, the compositional elements of the linear electrode 2 such as Ge or Zn may migrate towards the pad electrode 3 via the top of the linear electrode 2 or the contact area between the linear electrode 2 and the pad electrode 3 producing negative effects on the electrode characteristics, the electrode shape, and the like. In order to prevent this, barrier metal layers 2b and 3b can be formed within the layer structure of the linear electrode 2 and the layer structure of the pad electrode 3, respectively.

In more detail, due to diffusion migration of the compositional elements of the linear electrode 2 in the upward direction and the longitudinal direction, the linear electrode 2 may be cut, the Schottky contact characteristics between the topmost semiconductor layer 1a and the pad electrode 3 may become disturbed, or the bonding strength between the Au wire 4 of the pad electrode 3 may deteriorate. In order to prevent these issues, the barrier metal layer 2b can be provided within the layer structure of the linear electrode 2 and the barrier metal layer 3b can be provided within the layer structure of the pad electrode 3.

The barrier metal layer 3b can be provided making contact with the sidewall of the linear electrode 2 and can also be provided through another layer such as a first bonding layer 3a (described in more detail below).

There is also a possibility that the diffusion migration of the compositional elements of the linear electrode 2 in the upward direction will result in variations in the linear electrode shape or surface. This is especially apparent with a linear electrode 2 that has a thickness less than 5 μm, and in the worst case the linear electrode 2 may be cut. The linear electrode 2 can also be formed without any divisions at 2 μm by providing the barrier metal layer 2b within the layer structure that comprises the linear electrode 2.

Hereupon, the function of each layer in the layer structure of the linear electrode 2 will be described with reference to FIG. 4. If the layer on the side making contact with the topmost semiconductor layer 1a is described as the first layer, this first layer can be considered the linear electrode first ohmic layer 2a that forms an ohmic contact with the topmost semiconductor layer 1a. Examples of the material suitable for this layer 2a include AuGe, and the layer 2a is formed at a film thickness of 300 nm in this embodiment.

The linear electrode barrier metal layer 2b can be formed at a film thickness of 200 nm on the upper surface of the linear electrode ohmic layer 2a using TaN in order to prevent upward diffusion of the compositional elements of the linear electrode ohmic layer 2a. A linear electrode bonding layer 2c made of Ta can be formed on the linear electrode barrier metal layer 2b at a film thickness of 50 nm. Furthermore, a linear electrode second ohmic layer 2d made of Au can be formed on the surface of the linear electrode 2 at a film thickness of 200 nm.

Next, the configuration of the pad electrode 3 will be described. If the layer on the side making contact with the topmost semiconductor layer 1a is described as the first layer in like manner to the linear electrode 2, the first layer is a first bonding layer 3a. The material for the first bonding layer 3a is Ta, for example, and the layer 3a is formed at a film thickness of 50 nm, for example. The pad electrode first bonding layer 3a can function to bond the linear electrode second ohmic layer 2d and the pad electrode barrier metal layer 3b at the bonding area between the linear electrode 2 and the pad electrode 3. Since the linear electrode 2 makes contact with the pad electrode 3 partly on the sidewall of the linear electrode 2 and is conductive by that area, the adhesiveness can be high.

In this embodiment wherein the first bonding layer 3a is formed so as to cover the sidewall of the connection portion between the linear electrode 2, part of the first bonding layer 3a can also function as a barrier metal layer to prevent diffusion migration of the compositional elements of the linear electrode ohmic layer 2a in the lateral direction towards the pad electrode 3. Because of this, there may be little or no negative effects on the Schottky contact between the first bonding layer 3a and the topmost semiconductor layer 1a. Incidentally, the first bonding layer 3a, or Ta layer, can form a Schottky contact with the topmost semiconductor layer.

The second layer of the pad electrode 3 can be formed by TiWN at a film thickness of 200 nm and can function as the pad electrode barrier metal layer 3b to prevent diffusion migration of Ge, Zn (or other compositional elements of the linear electrode 2). A second bonding layer 3c of Ta at a film thickness of 50 nm can be formed as the third layer, for example, over the pad electrode barrier metal layer 3b. Furthermore, a bonding pad layer 3d of Au at a film thickness of 600 nm can be formed as the fourth layer, for example.

The second bonding layer 3c of Ta (the third layer) can bond the pad electrode barrier metal layer 3b (the second layer) and the bonding pad layer 3d of Au (the fourth layer). By making it possible to prevent diffusion of the compositional elements of the linear electrode 2 to the pad electrode 3, the Schottky characteristics between the pad electrode 3 and the topmost semiconductor layer 1a and the bonding strength of the wire in the bonding pad layer 3d can be maintained.

The fact that the pad electrode first bonding layer 3a (first layer of the pad electrode 3) also functions as a barrier layer is said to prevent lateral migration diffusion of the compositional elements of the linear electrode 2 in a direction towards the pad electrode 3. When migration diffusion of the compositional elements of the linear electrode 2 towards the pad electrode 3 occurs, the Schottky contact between the pad electrode 3 and the topmost semiconductor layer 1a may fail. Because of this, a phenomenon may be seen in which the light emission around the periphery of the pad electrode 3 becomes very noticeable when injecting electrical current.

As shown in FIG. 4, when the pad electrode first bonding layer 3a is formed from Ta, the above phenomenon may not be seen at all. Therefore, it could also be confirmed that this pad electrode first bonding layer 3a functions as a barrier metal layer as well. Other than Ta mentioned above, Ni or Ti can be used as materials that have a combined function of bonding layer and barrier layer to form the pad electrode first bonding layer 3a.

The results of trial production and test lighting performed by the inventors when forming a current confined path type light emitting diode verified that it is possible to narrow the line width of the linear electrode 2 from 5 μm to 2 μm compared to a conventional configuration depending on whether or not there is a layer structure as described above, including providing the barrier metal layer 2b as described above. If simply calculated, this means that the surface area of the linear electrode 2 that occupies the light emitting surface of the LED chip can be made 1/2.5 and the brightness as measured on the basis of the entire device increased by that amount.

The above described semiconductor device is only an exemplary embodiment. It should be understood that the invention is not limited to the specific structures and alternatives described above, and can be modified and combined in many different ways. In particular, the pad electrode 3 can be configured in different ways to maintain the Schottky characteristics of the Schottky contact with the topmost semiconductor layer 1a. Even in a configuration in which the pad electrode 3 has no Schottky contact with the topmost semiconductor layer 1a, many benefits are evident such as maintaining the bonding strength between the pad electrode 3 and the wire 4 electrode by preventing diffusion migration of the compositional elements of the linear electrode 2 in the lateral direction and the upward direction.

Since no light is emitted directly under the pad electrode 3 when the pad electrode 3 is formed using an ohmic electrode, it is possible to reverse the conductivity type of a p-type clad layer, to form an electrical current prevention layer on the p-type clad layer, or the like corresponding to the position where the pad electrode 3 is formed. In addition, an insulation layer, such as $SiO_2$, can also be formed while making contact with the topmost semiconductor layer 1a. In this type of configuration, the bonding strength between the bonding wire can be maintained by forming a barrier metal layer within the layer structure of the pad electrode 3.

The first bonding layer 3a and the second bonding layer 3c can be appropriately introduced as necessary. In the embodiment described above, the pad electrode 3 can also be formed as the two layer structure of the barrier metal layer 3b and the bonding pad layer 3d. For example, the pad layer can be formed to have a two layer structure including a 300 nm Ta barrier layer and a 600 nm Au bonding pad layer. Since the Ta film is hard, when thickly laminated, there is a high possibility that separation will occur at the boundary between other metal films. Consequently, it is possible to use the lamination structure in the embodiment described above to alleviate the stress or provide compatibility with the suitable barrier properties and adhesiveness by selecting materials.

Even further, when the first bonding layer 3a is provided, it is not always necessary to form the layer in the same region as the barrier metal layer 3b. It can be partially formed to cover only the upper surface and side wall of the linear electrode or only the topmost semiconductor layer. In addition, it can be partially formed using a different material. As described above, a high-quality semiconductor light emitting device can be provided.

Figure 5:
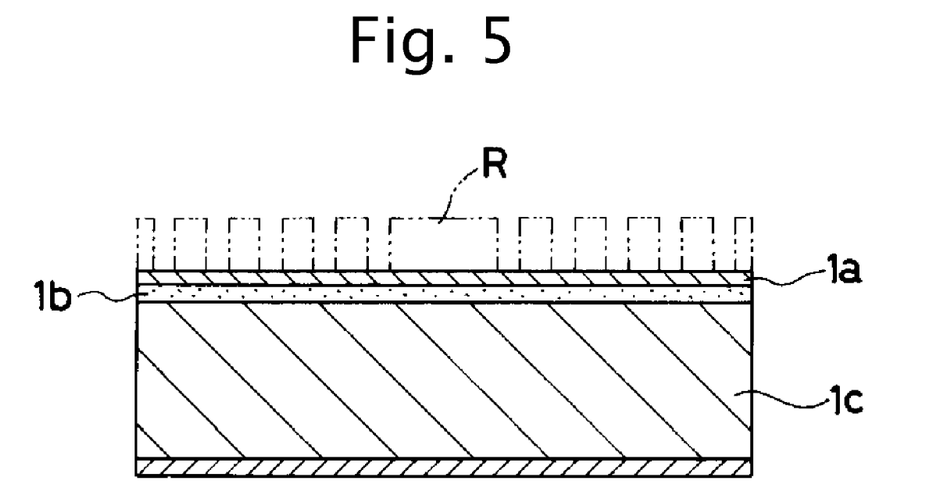
FIG. 5 is an explanatory view showing a first process of a manufacturing process of an embodiment of a semiconductor light emitting device made in accordance with principles of the invention.
Figure 6:
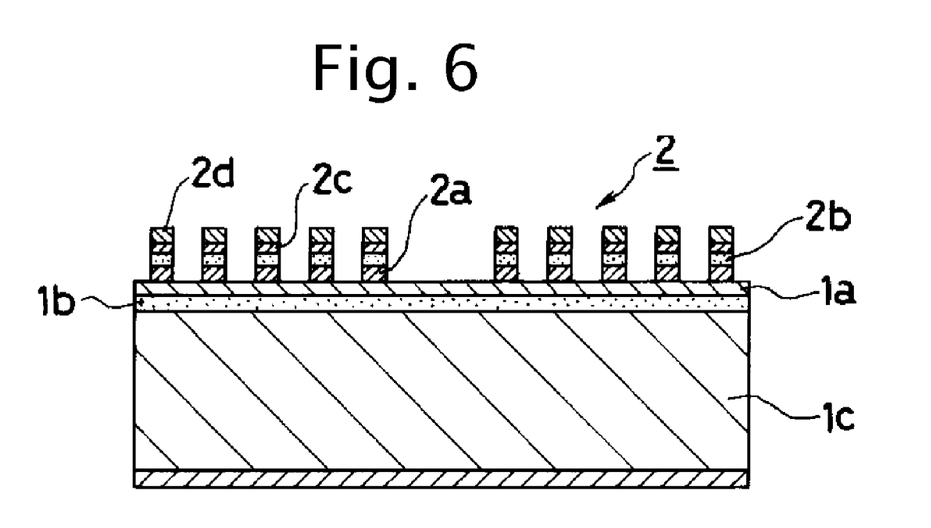
FIG. 6 is an explanatory view showing a second process of the manufacturing process of the semiconductor light emitting device of FIG. 5.
Figure 7:
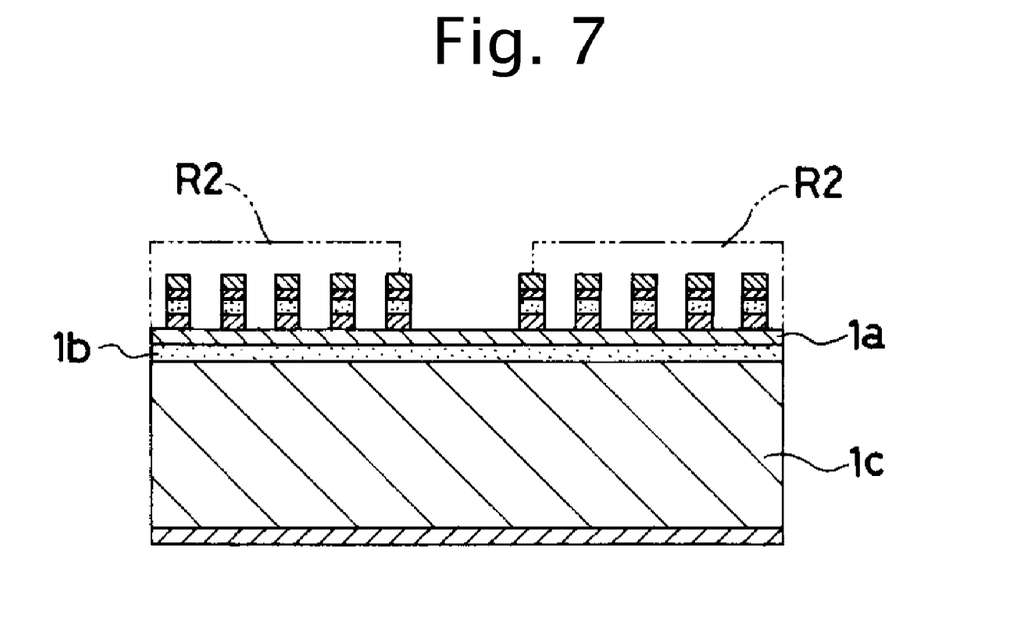
FIG. 7 is an explanatory view showing a third process of the manufacturing process of the semiconductor light emitting device of FIG. 5.
Figure 8:
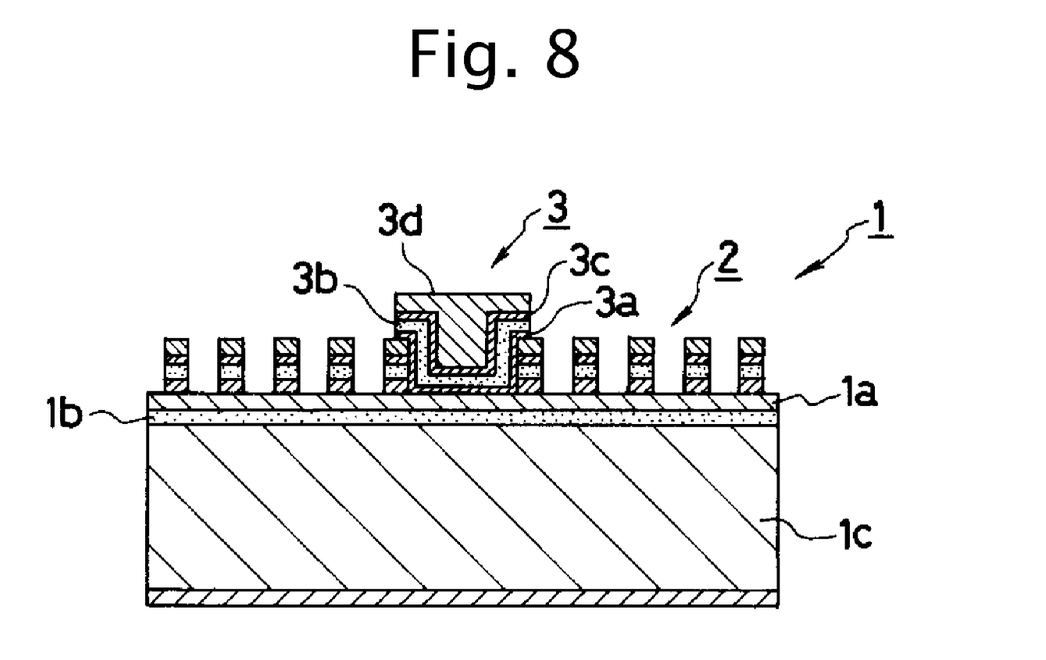
FIG. 8 is an explanatory view showing a completed state of the semiconductor light emitting device of FIG. 5.

Next, a method of forming an n-type topmost semiconductor layer 1a of the semiconductor light emitting device 1 will be described with reference to FIG. 5 to FIG. 8 in order. The linear electrode 2 is patterned using the resist R as roughly illustrated at the side of the topmost semiconductor layer 1a of the substrate 1c as shown in FIG. 5. At first, a resistance heating method is used to deposit AuGe at a film thickness of 300 nm as the linear electrode first ohmic layer 2a.

Next, sputtering is conducted to deposit TaN at a film thickness of 200 nm as the barrier metal layer 2b. Then, Ta is deposited at a film thickness of 50 nm as the linear electrode bonding layer 2c, and lastly Au is successively vacuum deposited at a film thickness of 200 nm to form the linear electrode second ohmic layer 2d. Thereafter, the resist R is removed by lift-off process (refer to FIG. 6).

Continuing, patterning for the pad electrode 3 (refer to FIG. 7) is performed using the resist R2 on the topmost semiconductor layer 1a. Sputtering is then conducted to deposit Ta at a film thickness of 50 nm to form the pad electrode first bonding layer 3a. Next, TiWN is deposited at a film thickness of 200 nm to form the pad electrode barrier metal layer 3b.

Next, Ta is deposited at a film thickness of 50 nm to form the pad electrode second bonding layer 3c, Au is vacuum deposited at 100 nm, and lastly a resistance heating is conducted to vacuum deposit Au at 500 nm. This results in the bonding pad 3d with a total thickness of 600 nm. Thereafter, the resist is removed by lift-off and a dicing street is formed by mesa etching. Alloying is then performed at 400° C. (refer to FIG. 8) to complete this exemplary embodiment of a method for manufacturing a semiconductor light emitting device 1. The pad electrode 3 is formed by lamination on one area on the linear electrode. In particular, the first bonding layer 3a and the barrier metal layer 3b are formed so as to cover without exposing the side wall of the portion (overlapping the pad electrode 3) of the ohmic electrode.

Hereupon, conditions will be illustrated for the pad electrode 3 to form a Schottky contact with the topmost semiconductor layer 1a. The barrier height, $q\phi n$, occurring due to contact between the metal and an n-type semiconductor (the topmost semiconductor layer 1a) can be solved using the equation $q(\phi m-\chi)$. Herein, $\phi m$ is the work function of the metal and $\chi$ is the electron affinity of the semiconductor. Therefore, when forming the pad electrode 3 on an n-type semiconductor, a metal material can be selected that has a work function larger than the electron affinity of the semiconductor.

In more detail, when n-AlGaInP with an electron affinity of approximately 4.1 eV is used as the n-type semiconductor that constitutes the topmost semiconductor layer 1a, Ti (4.33 eV), Pt (5.65 eV), Ni (5.15 eV), Al (4.28 eV), or Ta (4.25 eV) which has a work function greater than the above value should preferably be used. Incidentally, in the foregoing embodiments, the topmost semiconductor layer 1a serving as a current diffusion layer and the semiconductor layer 1b are formed on or above the substrate 1c. The semiconductor layer 1b other than the topmost semiconductor layer 1a may be a buffer layer, a p-type clad layer, an active layer, an n-type clad layer, or the combination thereof. They are formed directly on the substrate 1c in this order, or alternatively, separately formed layers may be adhered onto the substrate 1c.

The materials used for the various layers and structures described above are not limited to those literally disclosed with respect to the exemplary embodiments. Specifically, other known materials can be used that serve the various functions of the layers and structures as set forth above. In addition, the method described above should not be limited by the particular disclosure of layer sequencing or the functional description of the layers with respect to the exemplary method described.

While there has been described what are considered to be exemplary embodiments of the invention, it will be understood that various modifications may be made thereto, and it is intended that the appended claims cover all such modifications as fall within the true spirit and scope of the invention.

What is claimed is:

1. A semiconductor light emitting device comprising:
    a substrate;
    at least one semiconductor layer formed adjacent the substrate and having a topmost semiconductor layer;
    a pad electrode formed from a plurality of layers provided adjacent the topmost semiconductor layer; and
    a linear electrode provided adjacent the topmost semiconductor layer and making contact with part of the pad electrode, the linear electrode forming an ohmic contact with the topmost semiconductor layer and including an upper surface and a sidewall, wherein
    the pad electrode includes, as at least one of the plurality of layers, a barrier metal layer that is located adjacent part of or all of at least one of the upper surface and the sidewall of the linear electrode at a contact area between the linear electrode and the pad electrode, wherein the at least one semiconductor layer is the topmost semiconductor layer and the linear electrode includes a barrier metal layer.

2. The semiconductor light emitting device according to claim 1 wherein the pad electrode forms a Schottky contact with the topmost semiconductor layer.

3. The semiconductor light emitting device according to claim 1 wherein a bonding layer is provided at least one of:
    between the barrier metal layer of the pad electrode and the topmost semiconductor layer, and
    at the contact area between the linear electrode and the pad electrode.

4. The semiconductor light emitting device according to claim 2 wherein a bonding layer is provided at least one of:
    between the barrier metal layer of the pad electrode and the topmost semiconductor layer; and
    at the contact area between the linear electrode and the pad electrode.

5. The semiconductor light emitting device according to claim 1 wherein at least one layer among the plurality of layers of the pad electrode is a bonding layer that makes contact with the topmost semiconductor layer, and the bonding layer is formed from a material that has a barrier function.

6. The semiconductor light emitting device according to claim 2 wherein at least one layer among the plurality of layers of the pad electrode is a bonding layer that makes contact with the topmost semiconductor layer, and the bonding layer is formed from a material that has a barrier function.

7. The semiconductor light emitting device according to claim 3 wherein at least one layer among the plurality of layers of the pad electrode is a bonding layer that makes contact with the topmost semiconductor layer, and the bonding layer is formed from a material that has a barrier function.

8. The semiconductor light emitting device according to claim 1, wherein the linear electrode includes a plurality of layers, at least one of which is a barrier metal layer.

9. The semiconductor light emitting device according to claim 2 wherein the linear electrode includes a plurality of layers, at least one of which is a barrier metal layer.

10. The semiconductor light emitting device according to claim 3 wherein the linear electrode includes a plurality of layers, at least one of which is a barrier metal layer.

11. The semiconductor light emitting device according to claim 5 wherein the linear electrode includes a plurality of layers, at least one of which is a barrier metal layer.

12. The semiconductor light emitting device according to claim 1 wherein the linear electrode has at least one of a mesh type shape, a spider web shape, a radial pattern shape, and a grid pattern shape.

13. The semiconductor light emitting device according to claim 1 wherein the linear electrode is configured to distribute current substantially evenly over the topmost semiconductor layer.

14. The semiconductor light emitting device according to claim 1, wherein the linear electrode has a line width less than 5 µm.

15. The semiconductor light emitting device according to claim 1, wherein the linear electrode has a line width equal to or greater than 2 µm.

16. A semiconductor light emitting device comprising:
a substrate;
at least one semiconductor layer formed adjacent the substrate and having a topmost semiconductor layer;
a pad electrode formed from a plurality of layers provided adjacent the topmost semiconductor layer; and
a linear electrode provided adjacent the topmost semiconductor layer and making contact with part of the pad electrode, the linear electrode forming an ohmic contact with the topmost semiconductor layer and including an upper surface and a sidewall, wherein
the pad electrode includes, as at least one of the plurality of layers, a barrier metal layer that is located adjacent part of or all of at least one of the upper surface and the sidewall of the linear electrode at a contact area between the linear electrode and the pad electrode, wherein the barrier metal layer of the pad electrode is located at both the upper surface and the side wall of the linear electrode.

* * * * *

UNITED STATES PATENT AND TRADEMARK OFFICE
CERTIFICATE OF CORRECTION

PATENT NO. : 7,439,550 B2  Page 1 of 1
APPLICATION NO. : 11/276498
DATED : October 21, 2008
INVENTOR(S) : Yuko Tomioka et al.

It is certified that error appears in the above-identified patent and that said Letters Patent is hereby corrected as shown below:

Title Page;
Section (30) is missing and should be added as follows:

(30) Foreign Application Priority Data

Mar. 4, 2005 (JP) ……………………………….. 2005-060246

Signed and Sealed this

Thirtieth Day of December, 2008

JON W. DUDAS
*Director of the United States Patent and Trademark Office*